United States Patent
Jeong (12)

(10) Patent No.: US 6,184,085 B1
(45) Date of Patent: Feb. 6, 2001

(54) METHODS OF FORMING NONVOLATILE MEMORY DEVICES USING IMPROVED MASKING TECHNIQUES

(75) Inventor: Jae-Ik Jeong, Kyungki-do (KR)

(73) Assignee: Samsung Electronics Co., Ltd. (KR)

( * ) Notice: Under 35 U.S.C. 154(b), the term of this patent shall be extended for 0 days.

(21) Appl. No.: 09/329,592

(22) Filed: Jun. 10, 1999

(30) Foreign Application Priority Data

Jul. 3, 1998 (KR) .................................................. 98-26847

(51) Int. Cl.⁷ ................................................ H01L 21/8247
(52) U.S. Cl. .......................................... 438/258; 438/265
(58) Field of Search ..................................... 438/257–267

(56) References Cited

U.S. PATENT DOCUMENTS

| | | |
|---|---|---|
| 5,686,333 | * 11/1997 | Sato . |
| 5,830,771 | * 11/1998 | Fukatsu et al. . |
| 5,981,338 | * 11/1999 | Lee ........................................ 438/257 |
| 5,985,716 | * 11/1999 | Shimoji et al. ...................... 438/257 |

\* cited by examiner

*Primary Examiner*—Richard Booth
(74) *Attorney, Agent, or Firm*—Myers Bigel Sibley & Sajovec

(57) ABSTRACT

Methods of forming nonvolatile memory devices include the steps of forming a plurality of field oxide isolation regions on a semiconductor substrate. A thermal oxidation step may then be performed to define first gate insulating layers on active regions within the substrate. A blanket layer of polysilicon is then deposited as a first electrically conductive layer. Next, a blanket layer of an electrically insulating layer, which may comprise an oxide-nitride-oxide (ONO) composite insulating layer, is deposited. A blanket photoresist layer is then deposited on the electrically insulating layer. Conventional photolithography steps may then be performed to convert the blanket photoresist layer into a photoresist pattern on a memory cell array portion of the substrate. A dry etching step is then performed to define a floating gate electrode having an ONO electrically insulating cap thereon, on the memory cell array portion of the substrate. A wet etching step is then performed to remove the first gate insulating layer from the peripheral circuit portion of the substrate. This wet etching step is performed using the same mask (i.e., photoresist pattern) that was used during the dry etching step. Because this etching step causes portions of the floating gate electrodes to be undercut, a thermal oxidation step is then performed to grow sidewall insulating spacers on the sidewalls and undercut portions of the floating gate electrodes. Based on this thermal oxidation step, the floating gate electrodes become encapsulated by electrically insulating material.

10 Claims, 8 Drawing Sheets

US 6,184,085 B1

METHODS OF FORMING NONVOLATILE MEMORY DEVICES USING IMPROVED MASKING TECHNIQUES

RELATED APPLICATION

This application is related to Korean Application No. 98-26847, filed Jul. 3, 1998, the disclosure of which is hereby incorporated herein by reference.

FIELD OF THE INVENTION

This invention relates to integrated circuit device fabrication methods and devices formed thereby, and more particularly to methods of forming integrated circuit memory devices and devices formed thereby.

BACKGROUND OF THE INVENTION

Nonvolatile memory devices such as the EPROM device are widely used as unit cells of integrated circuit memory devices. As illustrated by FIGS. 1a–1b, a unit cell EPROM device ("I") according to the prior art includes a semiconductor substrate 10 having a plurality of field oxide isolation regions 12 therein and a plurality of gate oxide insulating layers 14a on a surface thereof. Floating gate electrodes 16a of the EPROM memory cell are also provided on the gate oxide insulating layers 14a. In addition, an electrically insulating oxide/nitride/oxide (ONO) capping layer 20 is provided on the floating gate electrodes 16a. A polycide control gate electrode 24 is also provided on a row of floating gate electrodes 16a and acts as a word line of the memory device.

Referring now to FIGS. 2–7, a method of forming the prior art memory device of FIGS. 1a–1b will now be described. In FIGS. 2–7, the portions of the substrate 10 designated by reference numeral "A" represent memory cell array portions of the substrate 10 and the portions of the substrate 10 designated by reference numeral "B" represent peripheral circuit portions of the substrate 10. As illustrated by FIG. 2, the prior art method includes the step of forming a plurality of field oxide isolation regions 12 on the semiconductor substrate 10. The portions of the substrate 10 that are not covered by the field oxide isolation regions 12 may comprise active regions. A thermal oxidation step may then be performed to define first gate insulating layers 14a on the active regions. A blanket layer of polysilicon is then deposited as a first electrically conductive layer 16. Next, a first photoresist pattern 18a may be formed on the first electrically conductive layer 16.

Referring now to FIG. 3, the first electrically conductive layer 16 may then be dry-etched to define a floating gate electrode 16a, using the first photoresist pattern 18a as an etching mask. The first photoresist pattern 18a is then removed. Next, a blanket layer of an electrically insulating layer 20, which may comprise an oxide-nitride-oxide (ONO) composite insulating layer, is deposited. A blanket photoresist layer is then deposited on the electrically insulating layer 20. Conventional photolithography steps may then be performed to convert the blanket photoresist layer into a second photoresist pattern 18b on the memory cell array portion "A" of the substrate.

Referring now to FIG. 4, an etching step is then performed to remove the portion of the electrically insulating layer 20 extending opposite the peripheral circuit portion "B" of the substrate 10. During this etching step, a portion of the first gate insulating layer 14a on the peripheral circuit portion "B" of the substrate may also be etched somewhat. As illustrated best by FIG. 5, a wet etching step is then performed to remove the first gate insulating layer 14a from the peripheral circuit portion "B" of the substrate 10. This etching step is performed using the second photoresist pattern 18b as an etching mask. Next, a blanket layer 22 of an electrically conductive material (e.g., polycide) is then deposited on the substrate 10.

Referring now to FIG. 6, a third photoresist pattern 18c is then formed on the peripheral circuit portion "B" of the substrate 10 using conventional techniques. A dry etching step is then performed to convert the blanket layer 22 of second electrically conductive material into a plurality of control electrodes 24 (e.g., word lines) having the shapes illustrated by FIG. 1a. Referring now to FIG. 7, the third photoresist pattern 18c is removed and followed by the step of forming a fourth photoresist pattern 18d on the substrate 10. This fourth photoresist pattern 18d exposes the peripheral circuit portion "B" of the substrate 10. Another etching step (e.g., dry etching step) is then performed to convert a portion of the blanket layer 22 on the peripheral circuit portion "B" of the substrate 10 into a gate electrode 26. The fourth photoresist pattern 18d is then removed.

Unfortunately, the use of four masks in the method of FIGS. 2–7 can limit process yield and increase manufacturing costs. Thus, notwithstanding the above-described method, there continues to be a need for improved methods of forming integrated circuit memory devices.

SUMMARY OF THE INVENTION

It is therefore an object of the present invention to provide improved methods of forming integrated circuit devices and devices formed thereby.

It is another object of the present invention to provide methods of forming integrated circuit memory devices having floating gate electrodes and memory devices formed thereby.

It is still another object of the present invention to provide methods of forming integrated circuit memory devices using a reduced number of photolithographically defined masking steps and devices formed thereby.

These and other objects, advantages and features of the present invention are provided by preferred methods of forming integrated circuit memory devices having floating gate electrodes, using a reduced number of photolithographically defined etching steps. These preferred methods include the steps of forming a plurality of field oxide isolation regions on a semiconductor substrate. A thermal oxidation step may then be performed to define first gate insulating layers on active regions within the substrate. A blanket layer of polysilicon is then deposited as a first electrically conductive layer. Next, a blanket layer of an electrically insulating layer, which may comprise an oxide-nitride-oxide (ONO) composite insulating layer, is deposited. A blanket photoresist layer is then deposited on the electrically insulating layer. Conventional photolithography steps may then be performed to convert the blanket photoresist layer into a photoresist pattern on a memory cell array portion of the substrate.

A dry etching step is then performed to define a floating gate electrode having an ONO electrically insulating cap thereon, on the memory cell array portion of the substrate. During this etching step, a portion of the first gate insulating layer on a peripheral circuit portion of the substrate may also be etched somewhat. In particular, after the dry etching step, the thickness of the first gate insulating layer on the peripheral circuit portion of the substrate may be reduced by about 20–30% of its original thickness. A wet etching step is then performed to remove the first gate insulating layer from the peripheral circuit portion of the substrate. This wet etching step is performed using the same mask (i.e., photoresist pattern) that was used during the dry etching step. During this wet etching step, portions of the field oxide isolation regions are also etched in the memory cell array portion of the substrate. In particular, the wet etching step causes portions of the floating gate electrodes to be undercut as portions of the underlying field oxide isolation regions are etched.

After the photoresist pattern is removed, a thermal oxidation step is then performed to grow a second gate insulating layer on the peripheral circuit portion of the substrate and grow sidewall insulating spacers on the sidewalls and undercut portions of the floating gate electrodes. Based on this thermal oxidation step, the floating gate electrodes become encapsulated by electrically insulating material. A blanket layer of a second electrically conductive material (e.g., polycide) is then deposited on the substrate. A second photoresist pattern is then formed on the peripheral circuit portion of the substrate using conventional techniques. This second photoresist pattern also extends onto the memory cell array portion of the substrate. A dry etching step is then performed to convert the blanket layer of second electrically conductive material into a plurality of control electrodes (e.g., word lines). The second photoresist pattern is then removed and followed by the step of forming a third photoresist pattern on the substrate. This third photoresist pattern exposes the peripheral circuit portion of the substrate. Another etching step (e.g., dry etching step) is then performed to convert a portion of the blanket layer on the peripheral circuit portion of the substrate into a gate electrode. The third photoresist pattern is then removed. Thus, methods of the present invention can utilize a reduced number of photolithographically defined masking steps relative to the prior art. In particular, a separate masking step need not be performed in order to etch the gate oxide insulating layer from the peripheral circuit portion of the substrate, since any undercutting of the floating gate electrodes can be remedied when the second gate insulating layer is formed using a thermal oxidation technique.

DESCRIPTION OF PREFERRED EMBODIMENTS

Figure 1A:
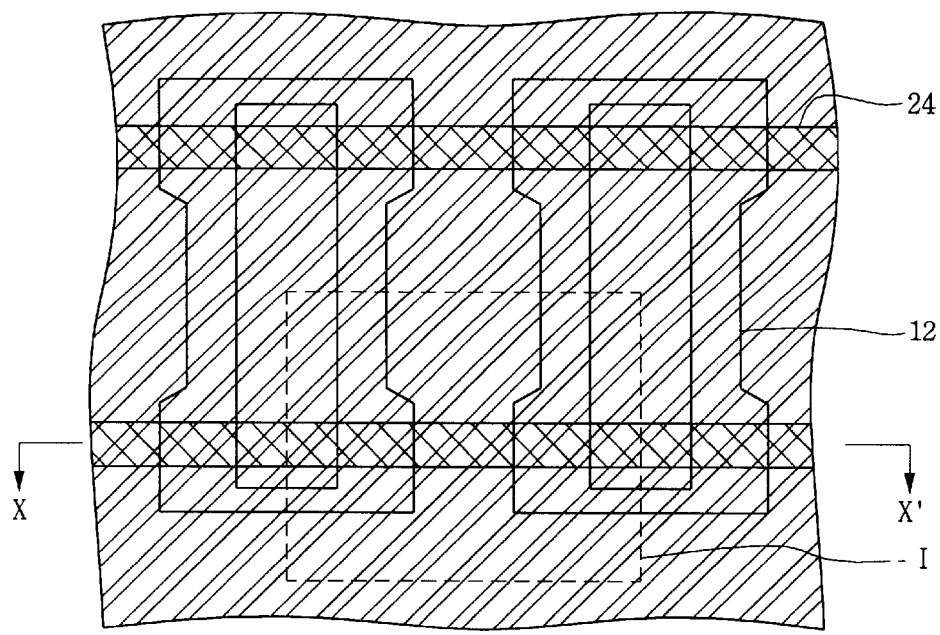
FIG. 1a is a plan layout view of a unit cell EPROM device according to the prior art.
Figure 1B:
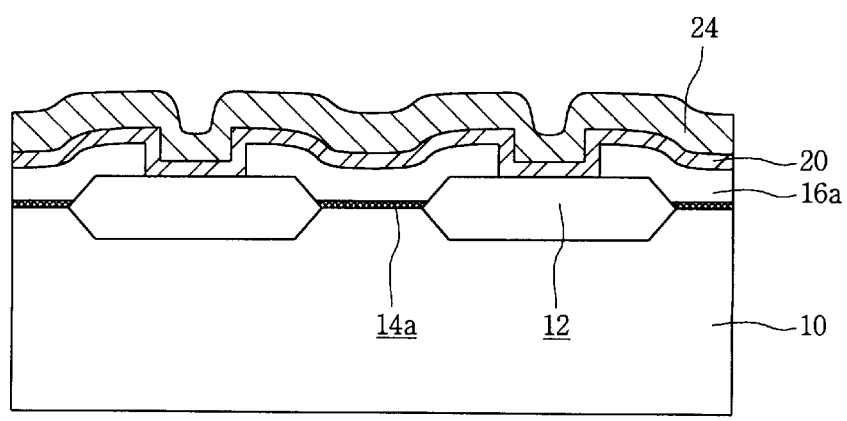
FIG. 1b is a cross-sectional view of the device of FIG. 1a, taken along line 1b–1b'.
Figure 2:
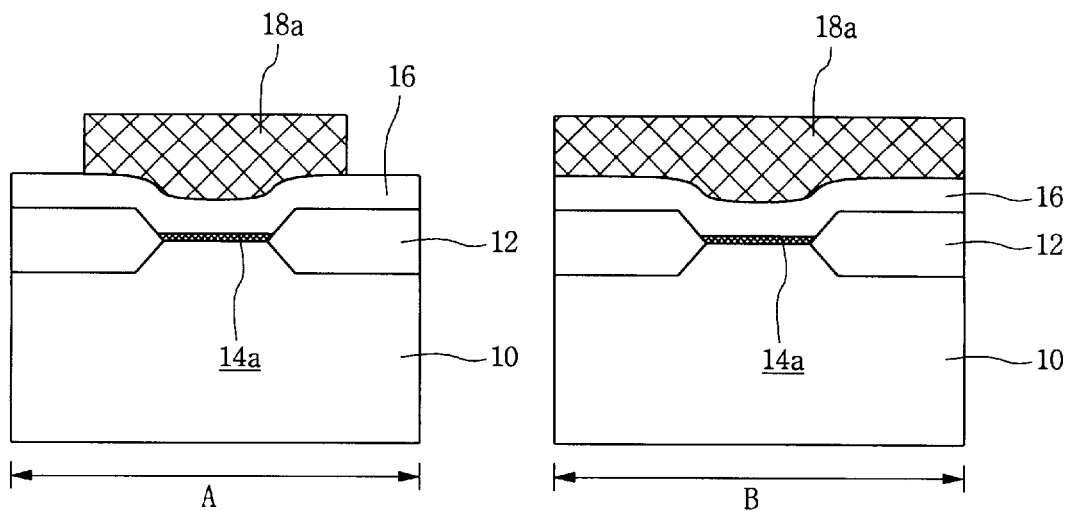
FIGS. 2–7 are cross-sectional views of intermediate structures which illustrate a conventional method of forming the device of FIG. 1b.
Figure 3:
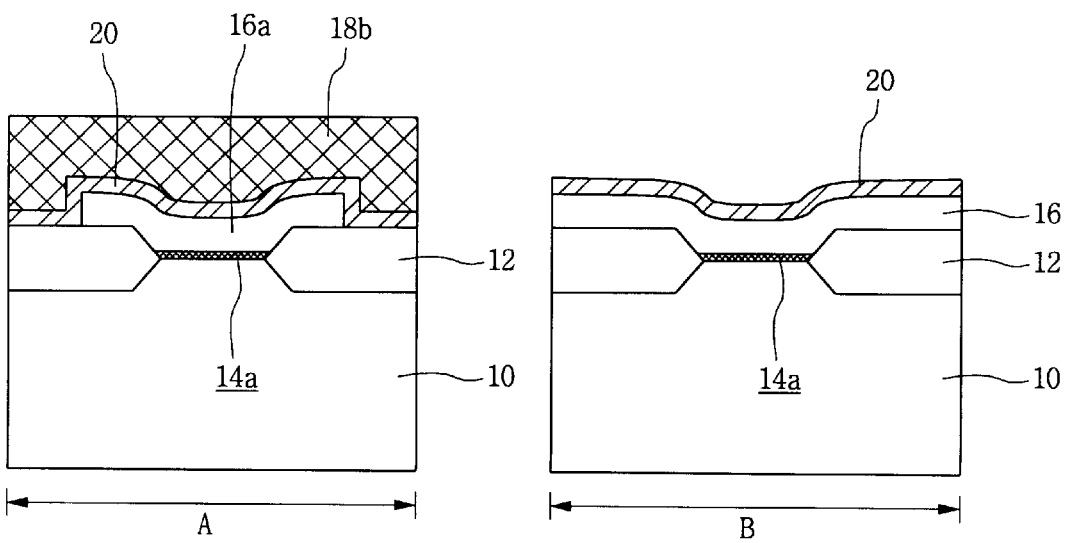
Figure 4:
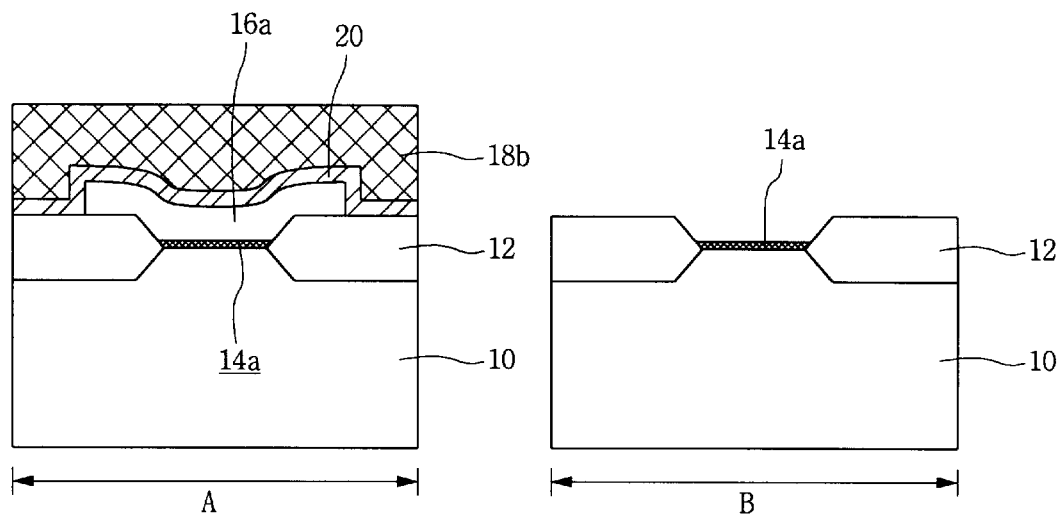
Figure 5:
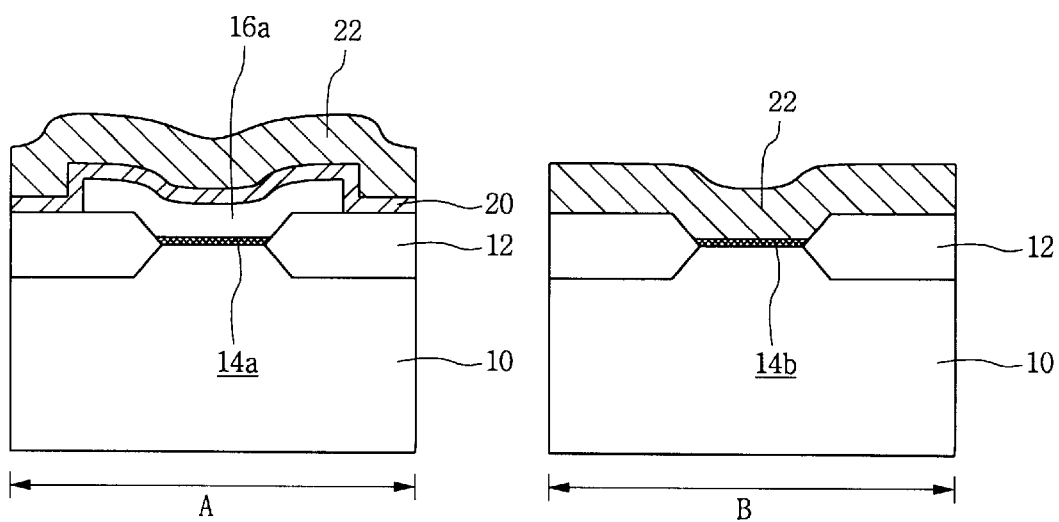
Figure 6:
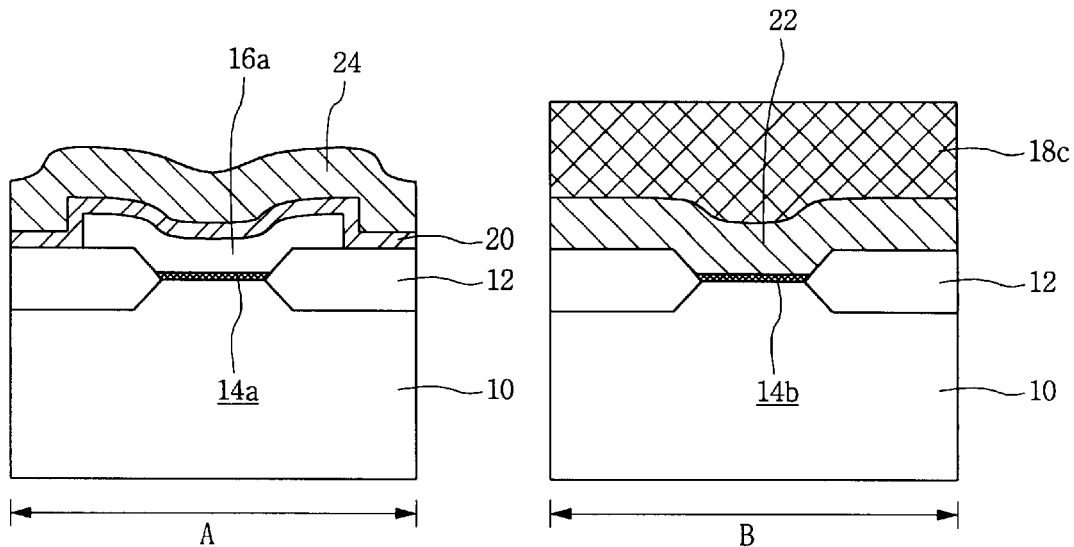
Figure 7:
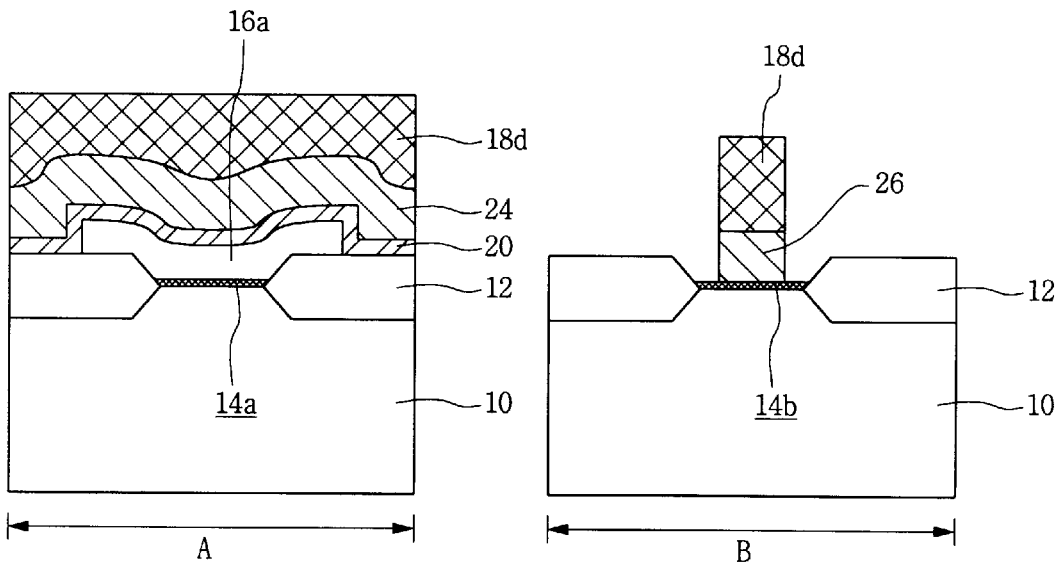

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 8A:
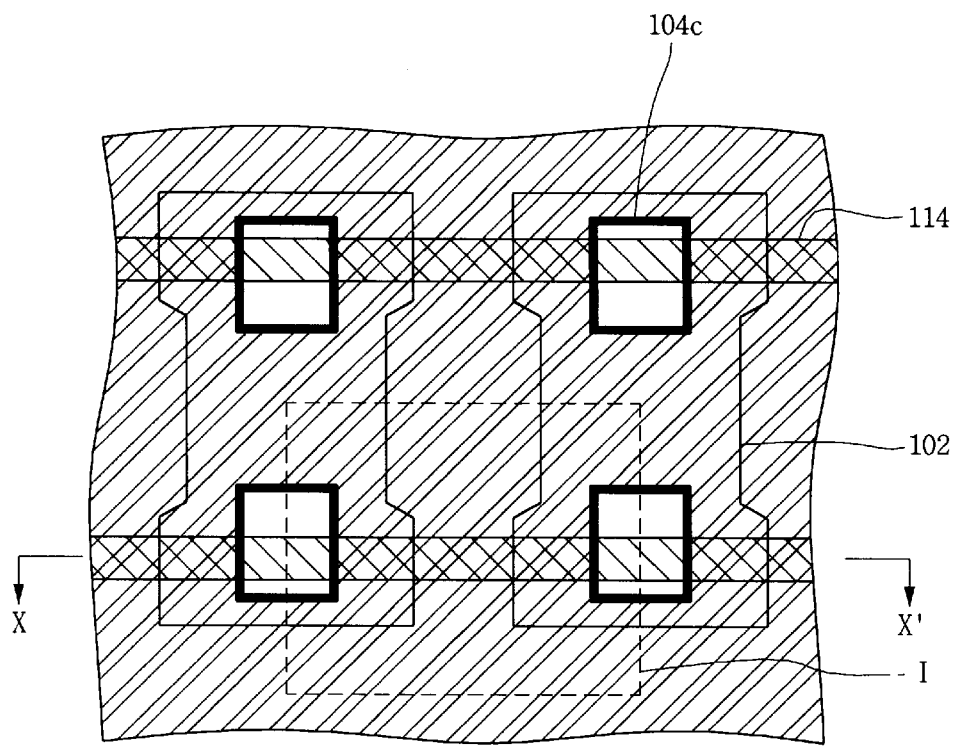
FIG. 8a is a plan layout view of a unit cell EPROM device according to an embodiment of the present invention.
Figure 8B:
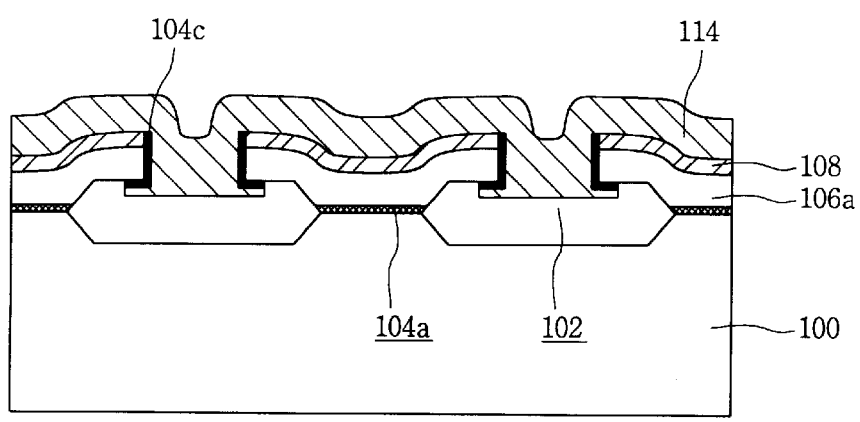
FIG. 8b is a cross-sectional view of the device of FIG. 8a, taken along line 8b–8b'.

Referring now to FIGS. 8a–8b and 9–13, preferred methods of forming integrated circuit memory devices having floating gate electrodes (e.g., EPROMs, EEPROMs) will be described. In particular, FIG. 8a is a layout view of an EPROM device according to the present invention and FIG. 8b is a cross-sectional view of the device of FIG. 8a, taken along line 8b–8b'. As illustrated, each unit cell EPROM device ("I") is spaced from adjacent unit cell devices by field oxide isolation regions 102. Each unit cell also comprises a conductive gate electrode 106a (e.g., polysilicon gate electrode) that is separated from a semiconductor substrate 100 by a respective gate oxide layer 104a. An electrically insulating layer 108 is also provided as an electrically insulating cap on each gate electrode 106a. This electrically insulating layer 108 may comprise a composite of a lower oxide layer, an intermediate nitride layer and an upper oxide layer (e.g., oxide-nitride-oxide (ONO) layer). Sidewall insulating spacers 104c are also provided on the sidewalls and undercut portions of the gate electrodes 106a. As described hereinbelow, these insulating spacers 104c may comprise thermally grown oxide. A control gate electrode 114 comprising a polycide material may also extend across a row of adjacent cells, as illustrated.

Referring now specifically to FIGS. 9–13, preferred methods of forming the memory device of FIGS. 8a–8b will be described. In FIGS. 9–13, the portions of the substrate 100 designated by reference numeral "A" represent memory cell array portions of the substrate 100 and the portions of the substrate 100 designated by reference numeral "B" represent peripheral circuit portions of the substrate 100.

Figure 9:
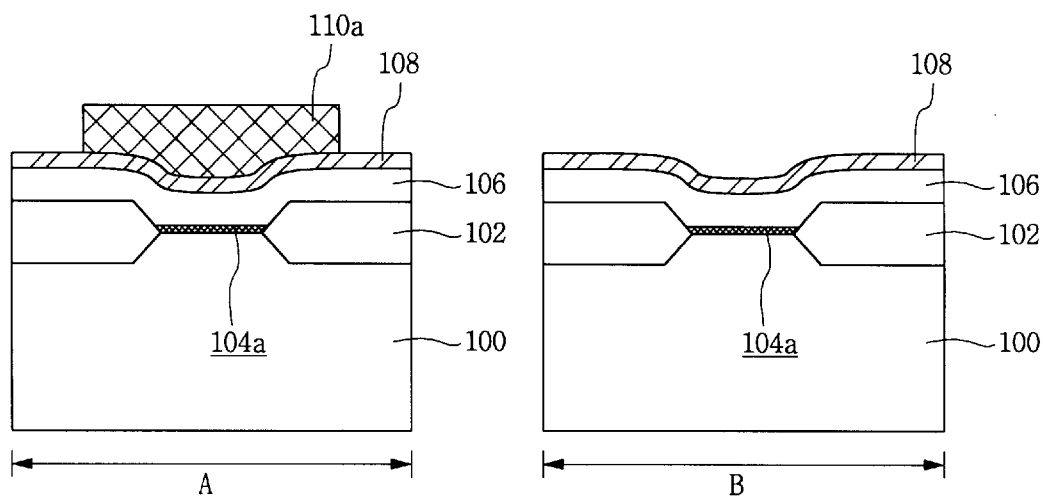
FIGS. 9–13 are cross-sectional views of intermediate structures which illustrate methods of forming nonvolatile memory devices according to the present invention.

As illustrated best by FIG. 9, the preferred methods include the steps of forming a plurality of field oxide isolation regions 102 on a semiconductor substrate 100. These field oxide isolation regions 102 may be formed by any one of a number of conventional techniques, including shallow trench isolation (STI) and local oxidation of silicon (LOCOS). As will be understood by those skilled in the art, the portions of the substrate 100 that are not covered by the field oxide isolation regions 102 may comprise active regions. A thermal oxidation step may then be performed to define first gate insulating layers 104a on the active regions. A blanket layer of polysilicon is then deposited as a first electrically conductive layer 106. Next, a blanket layer of an electrically insulating layer 108, which may comprise an oxide-nitride-oxide (ONO) composite insulating layer, is deposited. A blanket photoresist layer is then deposited on the electrically insulating layer 108. Conventional photolithography steps may then be performed to convert the blanket photoresist layer into a photoresist pattern 110a on the memory cell array portion "A" of the substrate. As illustrated, this photoresist pattern 110a extends between adjacent field oxide isolation regions 102.

Figure 10:
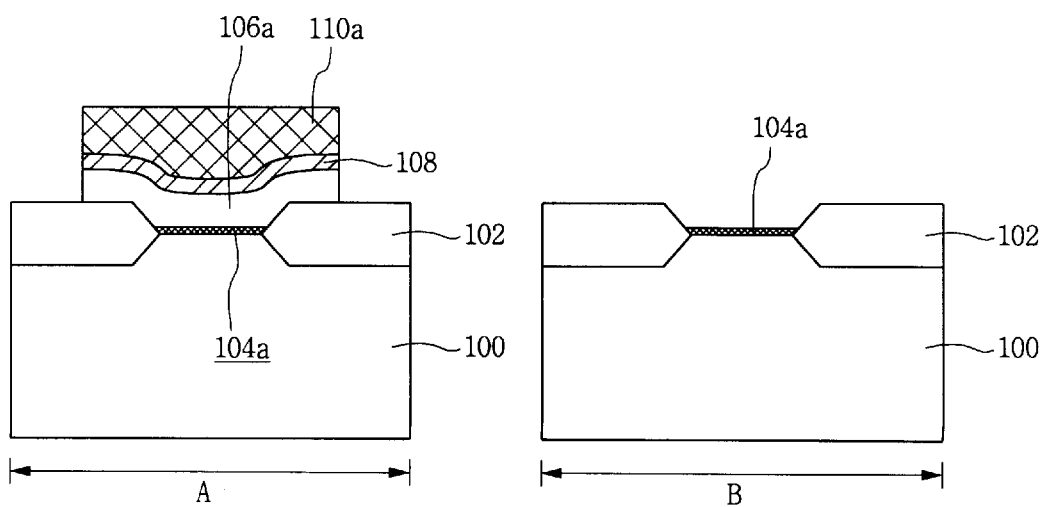
Figure 11:
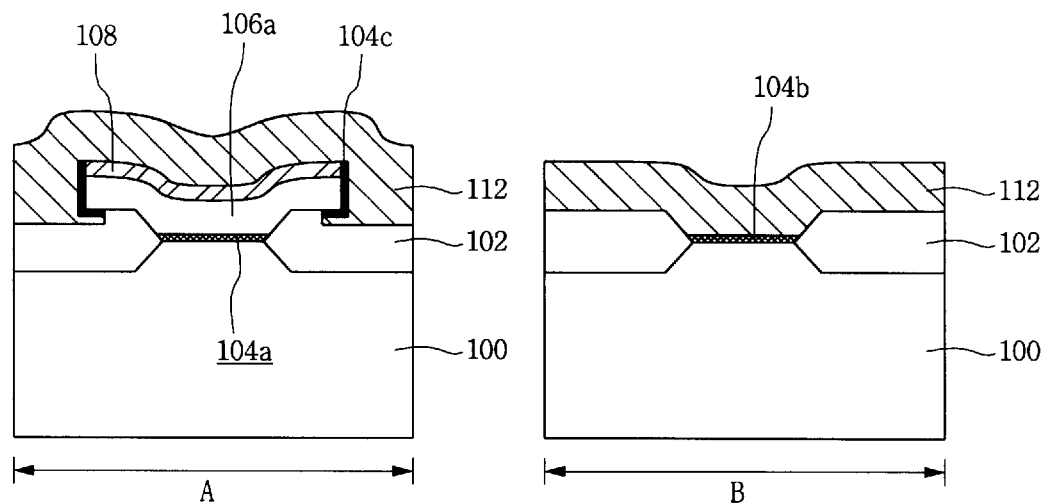

Referring now to FIG. 10, a dry etching step is then performed to define a floating gate electrode 106a having an ONO electrically insulating cap thereon, on the memory cell array portion "A" of the substrate. During this etching step, a portion of the first gate insulating layer 104a on the peripheral circuit portion "B" of the substrate may also be etched somewhat. In particular, after the dry etching step, the thickness of the first gate insulating layer 104a on the peripheral circuit portion of the substrate may be reduced by about 20–30% of its original thickness. As illustrated best by FIG. 11, a wet etching step is then performed to remove the first gate insulating layer 104a from the peripheral circuit portion "B" of the substrate 100. This wet etching step is performed using the same mask (i.e., photoresist pattern 110a) that was used during the dry etching step. During this wet etching step, portions of the field oxide isolation regions 102 are also etched in the memory cell array portion "A" of the substrate 100. In particular, the wet etching step causes portions of the floating gate electrodes 106a to be undercut as portions of the underlying field oxide isolation regions 102 are etched.

After the photoresist pattern 110a is removed, a thermal oxidation step is then performed to grow a second gate insulating layer 104b on the peripheral circuit portion "B" of the substrate 100 and grow sidewall insulating spacers 104c on the sidewalls and undercut portions of the floating gate electrodes 106a. Based on this thermal oxidation step, the floating gate electrodes 106a become encapsulated by electrically insulating material. A blanket layer 112 of a second electrically conductive material (e.g., polycide) is then deposited on the substrate 100.

Figure 12:
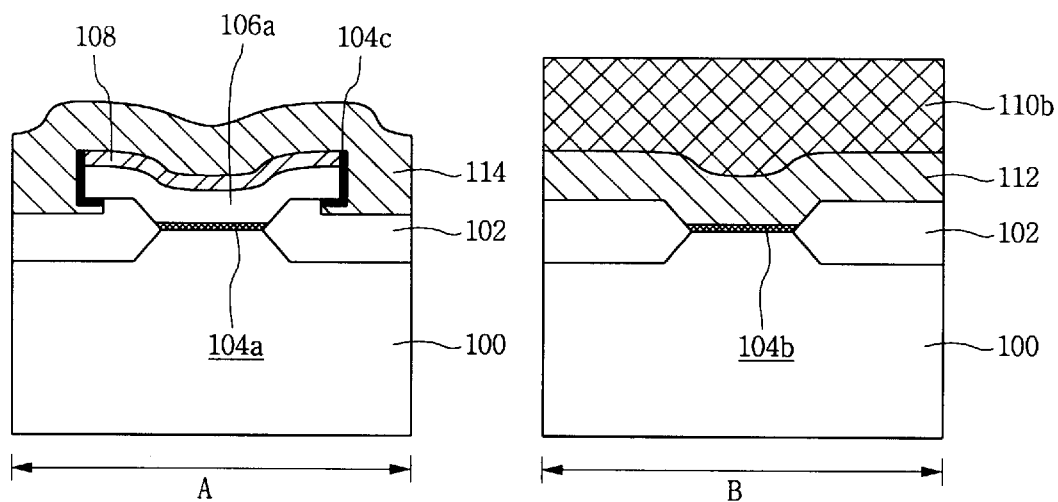
Figure 13:
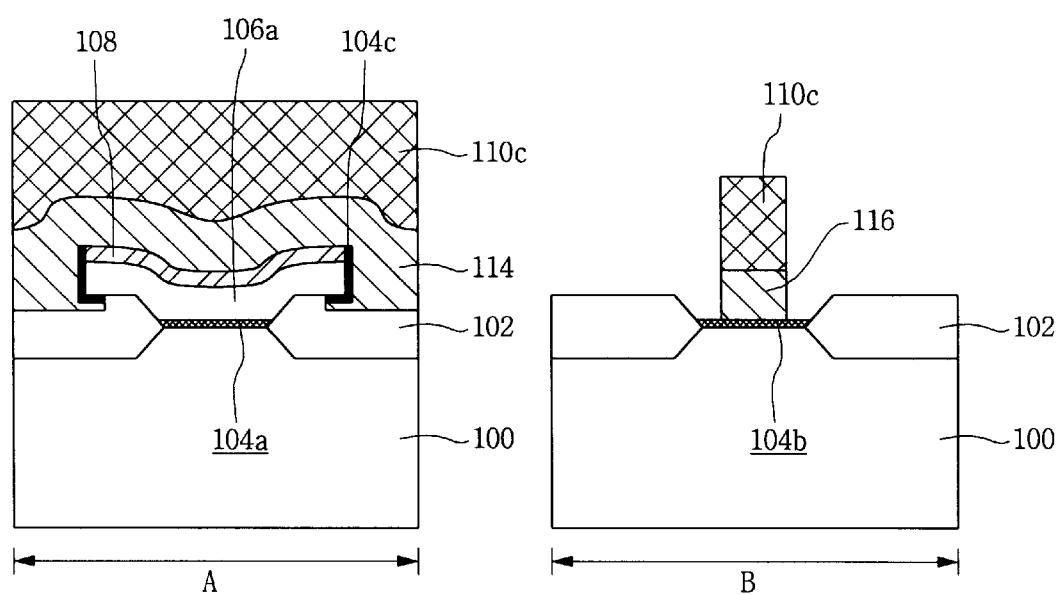

Referring now to FIG. 12, a second photoresist pattern 1 Ob is then formed on the peripheral circuit portion "B" of the substrate 100 using conventional techniques. This second photoresist pattern 110b also extends onto the memory cell array portion "A" of the substrate 100. A dry etching step is then performed to convert the blanket layer 112 of second electrically conductive material into a plurality of control electrodes 114 (e.g., word lines) having the shapes illustrated by FIG. 8a. Referring now to FIG. 13, the second photoresist pattern 110b is removed and followed by the step of forming a third photoresist pattern 110c on the substrate 100. This third photoresist pattern 110c exposes the peripheral circuit portion "B" of the substrate 100. Another etching step (e.g., dry etching step) is then performed to convert a portion of the blanket layer 112 on the peripheral circuit portion "B" of the substrate 100 into a gate electrode 116. The third photoresist pattern 110c is then removed.

As described above, methods of the present invention can utilize a reduced number of photolithographically defined masking steps relative to the prior art. In particular, a separate masking step need not be performed in order to etch the gate oxide insulating layer 104a from the peripheral circuit portion "B" of the substrate 100, since any undercutting of the floating gate electrodes 106a can be remedied when the second gate insulating layer 104b is formed using a thermal oxidation technique.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a memory cell having a floating gate therein, comprising the steps of:

forming a first electrically insulating layer on a surface of a semiconductor substrate;

forming a first conductive layer on the first electrically insulating layer, opposite the surface;

forming a second electrically insulating layer on the first conductive layer, opposite the first electrically insulating layer;

patterning the second electrically insulating and the first conductive layer to define a floating gate electrode having exposed sidewalls;

etching the first electrically insulating layer to define a recess therein that undercuts a portion of the floating gate electrode extending adjacent the exposed sidewalls;

oxidizing the exposed sidewalls and the undercut portion of the floating gate electrode to define sidewall insulating spacers; and forming a control electrode on the second electrically insulating layer, opposite the floating gate electrode.

2. The method of claim 1, wherein the first electrically insulating layer comprises a field oxide insulating layer; wherein the field oxide insulating layer has openings therein which expose active portions of the semiconductor substrate; and wherein said step of forming a first conductive layer on the first electrically insulating layer is preceded by the step of forming a plurality of gate oxide insulating layers on active portions of the substrate.

3. The method of claim 2, wherein the floating gate electrode contacts one of the gate oxide insulating layers; wherein the substrate includes a memory cell array region and a peripheral circuit region therein; and wherein said step of etching the first electrically insulating layer comprises simultaneously etching a portion of the field oxide insulating layer extending opposite the memory cell array region and another of the gate oxide insulating layers extending opposite the peripheral circuit region.

4. The method of claim 3, wherein the second electrically insulating layer comprises an oxide-nitride-oxide composite insulating layer.

5. The method of claim 4, wherein the first conductive layer comprises polysilicon; and wherein the control electrode comprises a polysilicide material.

6. The method of claim 1, wherein the second electrically insulating layer comprises an oxide-nitride-oxide composite insulating layer.

7. The method of claim 6, wherein the first conductive layer comprises polysilicon; and wherein the control electrode comprises a polysilicide material.

8. A method of forming a nonvolatile memory device, comprising the steps of:

forming a field oxide isolation region in a portion of a semiconductor substrate containing memory cell array and peripheral circuit regions therein;

forming a first gate oxide insulating layer on active portions of the memory cell array region and active portions of the peripheral circuit region;

forming a first conductive layer on the first gate oxide insulating layer and on the field oxide isolation region;

forming a second electrically insulating layer on the first conductive layer;

patterning the second electrically insulating and the first conductive layer to define a floating gate electrode on the memory cell array region;

simultaneously etching a portion of the field oxide isolation region extending opposite the memory cell array region and a portion of the first gate oxide insulating layer extending opposite the peripheral circuit region to expose the active portion of the peripheral circuit region and define a recess in the field oxide isolation region which undercuts the floating gate electrode;

oxidizing sidewalls and an undercut portion of the floating gate electrode to define sidewall insulating spacers; and forming a control electrode on the second electrically insulating layer, opposite the floating gate electrode.

9. The method of claim 8, wherein the second electrically insulating layer comprises an oxide-nitride-oxide composite insulating layer.

10. The method of claim 9, wherein the first conductive layer comprises polysilicon; and wherein the control electrode comprises a polysilicide material.

* * * * *